United States Patent
Yang et al.

(10) Patent No.: US 10,068,925 B2
(45) Date of Patent: Sep. 4, 2018

(54) THIN FILM TRANSISTOR, THIN FILM TRANSISTOR PANEL, AND METHOD FOR MANUFACTURING THE SAME

(71) Applicant: Samsung Display Co., Ltd., Yongin-si (KR)

(72) Inventors: Sung Hoon Yang, Seoul (KR); Shin Il Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/461,401

(22) Filed: Mar. 16, 2017

(65) Prior Publication Data
US 2017/0278873 A1 Sep. 28, 2017

(30) Foreign Application Priority Data
Mar. 24, 2016 (KR) .................. 10-2016-0035389

(51) Int. Cl.
*H01L 21/00* (2006.01)
*H01L 27/12* (2006.01)
(Continued)

(52) U.S. Cl.
CPC ........ *H01L 27/1225* (2013.01); *H01L 21/465* (2013.01); *H01L 21/47635* (2013.01);
(Continued)

(58) Field of Classification Search
CPC ........... H01L 29/7869; H01L 29/78606; H01L 29/41733; H01L 29/66969; H01L 27/1225;
(Continued)

(56) References Cited

U.S. PATENT DOCUMENTS 6,323,707 B1* 11/2001 Arai ................. H03K 19/00384
326/34
2009/0148972 A1* 6/2009 Fang ................... H01L 27/1255
438/30
(Continued)

FOREIGN PATENT DOCUMENTS

| JP | 2000349294 A | * 12/2000 | .......... H01L 29/786 |
|---|---|---|---|
| KR | 10-0034251 | 3/1990 | |
| KR | 10-2012-0116616 | 10/2012 | |
| KR | 10-2013-0126240 | 11/2013 | |
| KR | 10-1457705 | 11/2014 | |

OTHER PUBLICATIONS

Translation into English of Detailed Description of Jumonji et al (JP 2000349294-A), Obtained Dec. 12, 2017 online from from J-PLAT, https://www4.j-platpat.inpit.go.jp, machine translation appended as Office action Appendix.*

(Continued)

*Primary Examiner* — Jami M Valentine
(74) *Attorney, Agent, or Firm* — H.C. Park & Associates, PLC

(57) ABSTRACT

A thin film transistor includes a gate electrode, a semiconductor layer, a source electrode, and a drain electrode. The semiconductor layer overlaps the gate electrode and includes a channel layer comprising an oxide semiconductor and an auxiliary layer comprising amorphous silicon. The source electrode and the drain electrode are separated from each other and connected to the semiconductor layer. A thin film transistor array panel and method of manufacturing same also is disclosed.

20 Claims, 5 Drawing Sheets

(51) Int. Cl.
*H01L 23/535* (2006.01)
*H01L 29/417* (2006.01)
*H01L 29/786* (2006.01)
*H01L 29/66* (2006.01)
*H01L 21/465* (2006.01)
*H01L 21/4763* (2006.01)

(52) U.S. Cl.
CPC .......... *H01L 23/535* (2013.01); *H01L 27/124* (2013.01); *H01L 27/127* (2013.01); *H01L 27/1288* (2013.01); *H01L 29/41733* (2013.01); *H01L 29/66969* (2013.01); *H01L 29/7869* (2013.01)

(58) Field of Classification Search
CPC . H01L 27/124; H01L 27/127; H01L 27/1288; H01L 23/535; H01L 21/465; H01L 21/47635; H01L 29/78693; H01L 29/78696
USPC ............................................ 257/43; 438/104
See application file for complete search history.

(56) References Cited

U.S. PATENT DOCUMENTS

| | | | |
|---|---|---|---|
| 2010/0244029 A1* | 9/2010 | Yamazaki | H01L 27/1225 257/52 |
| 2013/0299817 A1 | 11/2013 | Park et al. | |
| 2013/0334530 A1* | 12/2013 | Katoh | H01L 27/1222 257/43 |
| 2014/0253858 A1* | 9/2014 | Kawano | G02F 1/134336 349/143 |
| 2015/0372087 A1* | 12/2015 | Fachmann | H01L 27/07 257/329 |
| 2016/0141312 A1* | 5/2016 | Nakatani | G09G 3/3655 349/43 |

OTHER PUBLICATIONS

N. Gabouze et al, Photoluminescence from porous layers formed on phosphorus—implanted silicon by Ag—assisted chemical etching, phys. stat, sol. (c) 4, 2007, 2160-2164, No. 6, Wiley-VCH Verlag GmbH&Co. KGaA, Weinheim.

* cited by examiner

THIN FILM TRANSISTOR, THIN FILM TRANSISTOR PANEL, AND METHOD FOR MANUFACTURING THE SAME

CROSS-REFERENCE TO RELATED APPLICATION

This application claims priority from and the benefit of Korean Patent Application No. 10-2016-0035389, filed on Mar. 24, 2016, which is hereby incorporated by reference for all purposes as if fully set forth herein.

BACKGROUND

Field

The invention relates generally to thin film transistors, and more particularly, to a thin film transistor, a thin film transistor array panel including the same, and a method for manufacturing the same that has the improved reliability.

Discussion of the Background

In a flat panel display such as a liquid crystal display (LCD) or an organic light emitting diode (OLED) display, a thin film transistor (TFT) is generally used as a switching element for independently driving each pixel. A thin film transistor array panel including the thin film transistor includes a scanning signal line (gate line) for transmitting a scanning signal to the thin film transistor and a data line for transmitting a data signal, as well the thin film transistor and a pixel electrode connected thereto.

A thin film transistor array panel includes a plurality of thin film transistors, and each thin film transistor includes a gate electrode connected to the gate line, a source electrode connected to the data line, a drain electrode connected to the pixel electrode, and a semiconductor layer disposed on the gate electrode between the source electrode and the drain electrode. The data signal from the data line is transmitted to the pixel electrode depending on the gate signal from the gate line.

The thin film transistor array panel is typically formed from layers grown in a semiconductor deposition or similar process. A channel of the thin film transistor may be formed in the semiconductor layer to drive a corresponding pixel after manufacturing is complete. In the process of forming the data line, the source electrode, and the drain electrode, the semiconductor layer may be over-etched. If the semiconductor layer is over-etched, the channel of the thin film transistor may not be formed properly, and the thin film transistor may not drive the pixel properly or reliably.

The above information disclosed in this Background section is only for enhancement of understanding of the background of the inventive concepts, and, therefore, it may contain information that does not form the prior art that is already known in this country to a person of ordinary skill in the art.

SUMMARY

Thin film transistors and thin film transistor array panels constructed according to the principles and manufacturing methods of the invention protect the semiconductor layer in which the channel of the thin film transistor is formed from over-etching and other manufacturing defects, without a requiring separate process, thereby improving reliability and reducing the costs of manufacturing the thin film transistor and thin film transistor array panels.

Additional aspects will be set forth in the detailed description which follows, and, in part, will be apparent from the disclosure, or may be learned by practice of the inventive concepts.

According to one aspect of the invention, a thin film transistor includes: a gate electrode; a semiconductor layer overlapping the gate electrode and including a channel layer comprising an oxide semiconductor and an auxiliary layer comprising amorphous silicon; and a source electrode and a drain electrode separated from each other and connected to the semiconductor layer.

A thickness of the auxiliary layer may be about 100 Å or less.

The auxiliary layer may be disposed between the channel layer and the source electrode, and between the channel layer and the drain electrode.

The source electrode and the drain electrode each may include a barrier layer, a wiring layer, and a capping layer.

The barrier layer and the capping layer may include at least one material selected from the group consisting of molybdenum (Mo), titanium (Ti), chromium (Cr), tantalum (Ta), indium-zinc oxide (IZO), or indium-tin oxide (ITO), and the wiring layer may include at least one material selected from the group consisting of copper (Cu), silver (Ag), or aluminum (Al).

The thin film transistor may further include an ohmic contact layer disposed between the source electrode and the auxiliary layer, and between the drain electrode and the auxiliary layer.

The channel layer and the auxiliary layer may be disposed in a stacked relationship.

The channel layer and the auxiliary layer may abut each other.

According to another aspect of the invention, a thin film transistor array panel includes: an insulation substrate; a gate electrode disposed on the insulation substrate; a semiconductor layer overlapping the gate electrode and including a channel layer including an oxide semiconductor and an auxiliary layer including amorphous silicon; a source electrode and a drain electrode separated from each other and connected to the semiconductor layer; and a pixel electrode connected to the drain electrode.

According to yet another aspect of the invention, a method for manufacturing a thin film transistor array panel includes the steps of: forming a gate electrode on an insulation substrate; forming a gate insulating layer on the gate electrode; sequentially forming a semiconductor material layer, an ohmic contact material layer, and a data metal layer on the gate insulating layer; and etching the semiconductor material layer, the ohmic contact material layer, and the data metal layer to form a semiconductor layer, an ohmic contact layer, a source electrode, and a drain electrode The semiconductor material layer includes an oxide semiconductor layer and an amorphous silicon layer.

The steps of forming the semiconductor layer, the ohmic contact layer, the source electrode, and the drain electrode includes forming, on the data metal layer, a first photosensitive film including a first portion and a second portion thicker than the first portion, etching the semiconductor material layer, the ohmic contact material layer, and the data metal layer by using the first photosensitive film as a mask, ashing the first photosensitive film to remove the first portion of the first photosensitive film and to form a second photosensitive film having at least part of the second portion of the first photosensitive film, and etching the ohmic contact material layer and the data metal layer by using the second photosensitive film as a mask.

The step of etching the semiconductor material layer, the ohmic contact material layer, and the data metal layer by using the first photosensitive film as a mask may include a first wet etching process of etching the data metal layer, and a dry etching process of etching the semiconductor material layer and the ohmic contact material layer.

The step of etching the ohmic contact material layer and the data metal layer by using the second photosensitive film as a mask may include a second wet etching process of etching the ohmic contact material layer and the data metal layer.

The first wet etching process and the second wet etching process may use an etchant including one selected from the group consisting of sodium peroxodisulfate ($Na_2SO_2O_8$), ammonium hydrogen difluoride ($NH_4HF_2$), nitric acid ($HNO_3$), and acetic acid ($CH_3COOH$).

The step of forming a data metal layer may include forming a barrier layer, a wiring layer, and a capping layer.

The barrier layer and the capping layer may include at least one material selected from the group consisting of molybdenum (Mo), titanium (Ti), chromium (Cr), tantalum (Ta), indium-zinc oxide (IZO), or indium-tin oxide (ITO), and the wiring layer may include at least one material one selected from the group consisting of copper (Cu), silver (Ag), or aluminum (Al).

According to the principles and exemplary embodiments of the invention, the semiconductor layer includes a channel layer having an oxide semiconductor material and an auxiliary layer having an amorphous silicon material, and the auxiliary layer protects the channel layer during the etching process, thereby the channel layer may be protected without an additional manufacturing process, such as forming another etching prevention layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
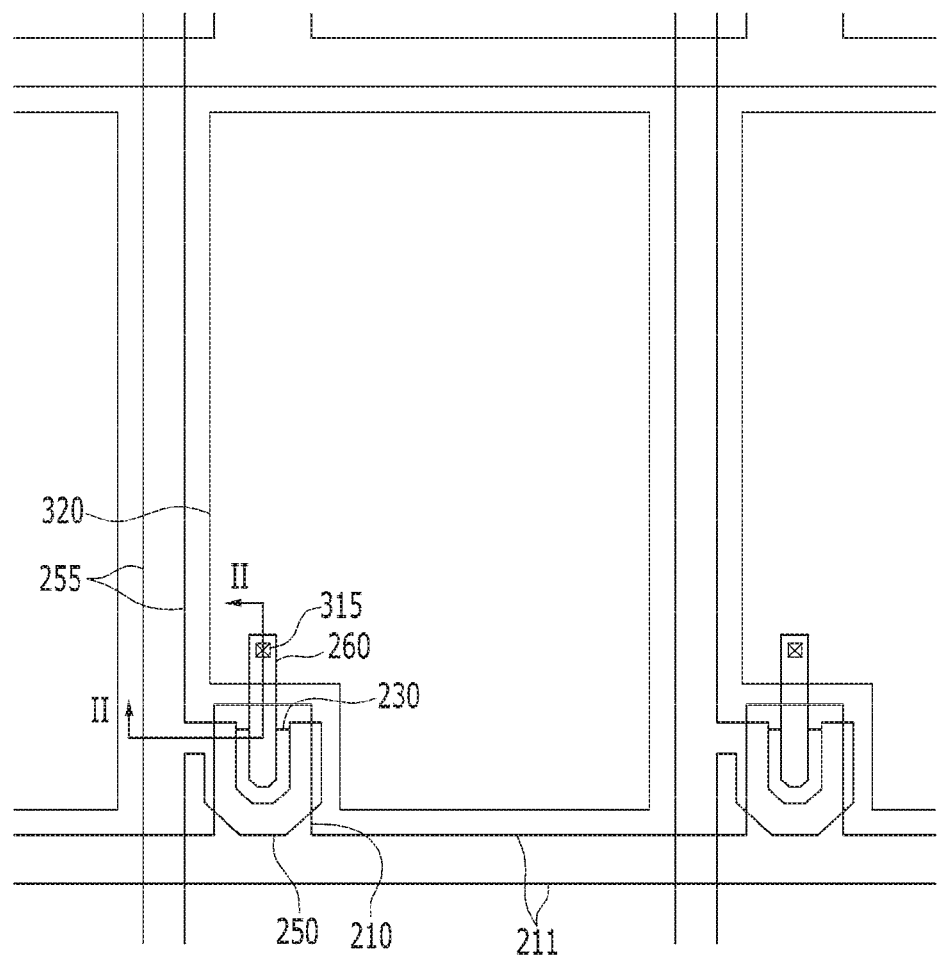
FIG. 1 is a layout view of an embodiment of a thin film transistor array panel constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A thin film transistor array panel according to an exemplary embodiment of the invention will now be described with reference to FIG. 1 and FIG. 2.

FIG. 1 is a layout view of an embodiment of a thin film transistor array panel constructed according to the principles of the invention. FIG. 2 is a cross-sectional view of the thin film transistor array panel of FIG. 1 taken along a line II-II.

Figure 2:
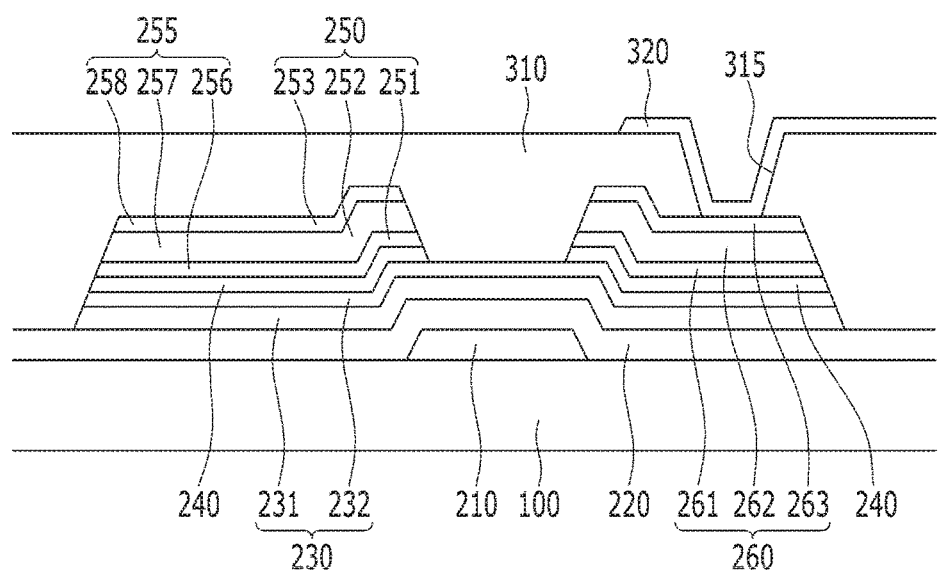
FIG. 2 is a cross-sectional view of the thin film transistor array panel of FIG. 1 taken along a line II-II.

Referring to FIG. 1 and FIG. 2, a plurality of gate lines 211 are disposed in an insulation substrate 100 made of a transparent glass or plastic.

The gate line 211 transmits a gate signal and extends substantially horizontally. Each gate line 211 includes a plurality of gate electrodes 210 protruded from the gate line 211.

The gate line 211 and the gate electrode 210 may be formed of one or more materials selected from the group consisting of an aluminum-based metal including aluminum (Al) and an aluminum alloy, a silver-based metal including silver (Ag) and a silver alloy, and a copper-based metal including copper (Cu) and a copper alloy.

In the illustrated embodiments, the gate line 211 and the gate electrode 210 are formed as a single layer, but they may be formed in other ways known in the art, such as a double-layer structure or a triple-layer structure.

When the gate line 211 and the gate electrode 210 are formed as the double-layer structure, the gate line 211 and the gate electrode 210 include a lower layer and an upper layer. The lower layer may be formed of one or more materials selected from the group consisting of a molybdenum-based metal including molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may be formed of one or more materials selected from the group consisting of an aluminum-based metal including aluminum (Al) and an aluminum alloy, a silver-based metal including silver (Ag) and a silver alloy, and a copper-based metal including copper (Cu) and a copper alloy.

In that the case where the gate line 211 and the gate electrode 210 are formed as a triple-layer structure, layers having different physical properties may be combined.

A gate insulating layer 220 is disposed on the gate line 211 and the gate electrode 210. The gate insulating layer 220 may be made of a silicon oxide (SiOx). In the illustrated embodiments, the gate insulating layer 220 is formed as a single-layered structure, however, it may be formed in other ways known in the art, such as a double-layer structure.

When the gate insulating layer 220 is a double-layer structure, the gate insulating layer 220 may include the lower layer and the upper layer. In this case, the lower layer may be made of a silicon nitride (SiNx) or silicon oxynitride (SiON), and the upper layer may be made of a silicon oxide (SiOx).

A plurality of semiconductor layers 230 is disposed on the gate insulating layer 220.

The semiconductor layer 230 includes a channel layer 231 disposed on the gate insulating layer 220 and an auxiliary layer 232 disposed on the channel layer 231. Here, the auxiliary layer 232 may be thinner than the channel layer 231.

The channel layer 231 may include an oxide semiconductor including one or more materials selected from the group consisting of zinc (Zn), gallium (Ga), tin (Sn), and indium (In). The thickness of the channel layer 231 may be in a range of about 300 Å to about 500 Å.

The auxiliary layer 232 may be made of amorphous silicon (a-Si). The thickness of the auxiliary layer 232 may be about 100 Å or less.

FIG. 2 shows the structure in which the semiconductor layer 230 is disposed above the gate electrode 210, however the exemplary embodiments are not limited thereto, and the semiconductor layer 230 may be disposed in all other positions known in the art, including under the gate electrode 210 or overlapping the gate electrode 210.

A plurality of data lines 255 and a plurality of drain electrodes 260 are disposed on the semiconductor layer 230.

The data line 255 transmits a data signal and extends substantially in a vertical direction, thereby intersecting the gate line 211. Each data line 255 includes a plurality of source electrodes 250 extending toward the gate electrode 210 and having a "U" shape.

The drain electrode 260 is separated from the data line 255 and extends upward in the center of the "U" shape of the source electrode 250. The shapes of the source electrode 250 and the drain electrode 260 shown in FIG. 1 are merely exemplary, and may be variously changed.

The data line 255, the source electrode 250, and the drain electrode 260 respectively include a barrier layer (256, 251, and 261), a wiring layer (257, 252, and 262), and a capping layer (258, 253, and 263). The wiring layer (257, 252, and 262) may be thicker than the barrier layer (256, 251, and 261) and the capping layer (258, 253, and 263).

The barrier layer (256, 251, and 261) and the capping layer (258, 253, and 263) may be made of a refractory metal and/or a metal having an excellent contact characteristic. The refractory metal may include molybdenum (Mo), titanium (Ti), chromium (Cr), tantalum (Ta), or alloys thereof. The metal having excellent contact characteristics may include indium-zinc oxide (IZO) or indium-tin oxide (ITO).

The wiring layer (257, 252, and 262) may be made of an aluminum-based metal, a silver-based metal, or a copper-based metal as a metal having low resistivity.

An ohmic contact layer 240 may be disposed between the semiconductor layer 230 and the data line 255 and between the semiconductor layer 230 and the drain electrode 260. The ohmic contact layer 240 lowers contact resistance between the semiconductor layer 230 and the data line 255 and between the semiconductor layer 230 and the drain electrode 260. The ohmic contact layer 240 may be made of n+ hydrogenated amorphous silicon doped with an n-type impurity such as phosphorus (P) at a high concentration.

One gate electrode 210, one source electrode 250, and one drain electrode 260 form one thin film transistor (TFT) along with the semiconductor layer 230. The channel of the thin film transistor is formed in the channel layer 231 of the semiconductor layer 230 between the source electrode 250 and the drain electrode 260. The channel layer 231 overlaps the gate electrode 210.

Accordingly, the channel of the thin film transistor is not formed in the auxiliary layer 232, but is formed in the channel layer 231. The thickness of the auxiliary layer 232 is about 100 Å or less such that the channel of the thin film transistor is not formed therein, thereby preventing a hump phenomenon due to the channel.

Also, the auxiliary layer 232 is disposed on the channel layer 231, thereby protecting the channel layer 231 from the external environment. By forming the auxiliary layer 232 together with the channel layer 231, the channel layer 231 may be protected without requiring an additional process step during manufacture. As shown in FIG. 2, the auxiliary layer 232 is disposed between the channel layer 231 and the source electrode 250 (on the left side of gate electrode 210) and between the channel layer 231 and the drain electrode 260 (on the left side of gate electrode 210). The auxiliary layer 232 functions as an etching prevention layer protecting the channel layer 231 during an etching process, for example, when etching the source electrode 250 and the drain electrode 260, and may also function as a portion of the semiconductor layer 230 in the operation of the thin film transistor. Accordingly, by providing the auxiliary layer 232 according to the exemplary embodiments, the channel layer 231 may be prevented from being over-etched thereby improving the characteristics of the device and avoiding separate manufacturing processes for removing the etching prevention layer. This will be described in detail later.

A passivation layer 310 is disposed on the data line 255, the drain electrode 260, and the semiconductor layer 230, and the passivation layer 310 has a contact hole 315 overlapping the drain electrode 260. The passivation layer 310 may be made of an inorganic material or an organic material. However, other configurations are possible. For example, the passivation layer 310 may include a lower layer made of inorganic material and an upper layer made of organic material.

A plurality of pixel electrodes 320 is disposed on the passivation layer 310. Each pixel electrode 320 is connected to a drain electrode 260 through the contact hole 315.

Next, a method of manufacturing a thin film transistor array panel according to an exemplary embodiment of the invention will be described with reference to FIG. 3 to FIG. 8 as well as FIG. 2.

FIG. 3 to FIG. 8 are cross-sectional views illustrating a method of manufacturing a thin film transistor array panel constructed according to the principles of the invention. The layers of the panel may be formed by any means or methods known in the art such a chemical or vapor deposition or other techniques.

Figure 3:
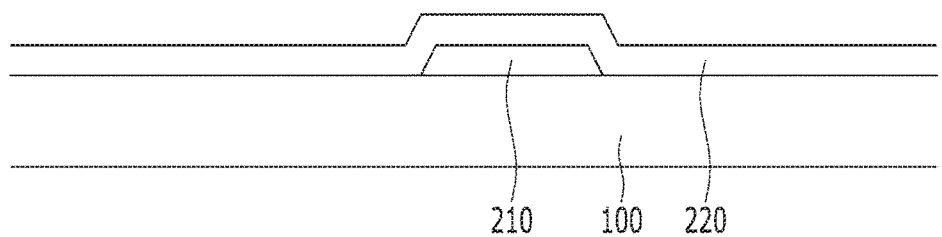
FIG. 3 to FIG. 8 are cross-sectional views illustrating a method of manufacturing a thin film transistor array panel constructed according to the principles of the invention.

Referring to FIG. 3, after forming a gate electrode 210 on the insulation substrate 100, a gate insulating layer 220 is formed on the gate electrode 210. In this case, when forming the gate electrode 210, a gate line 211 is simultaneously formed.

Figure 4:
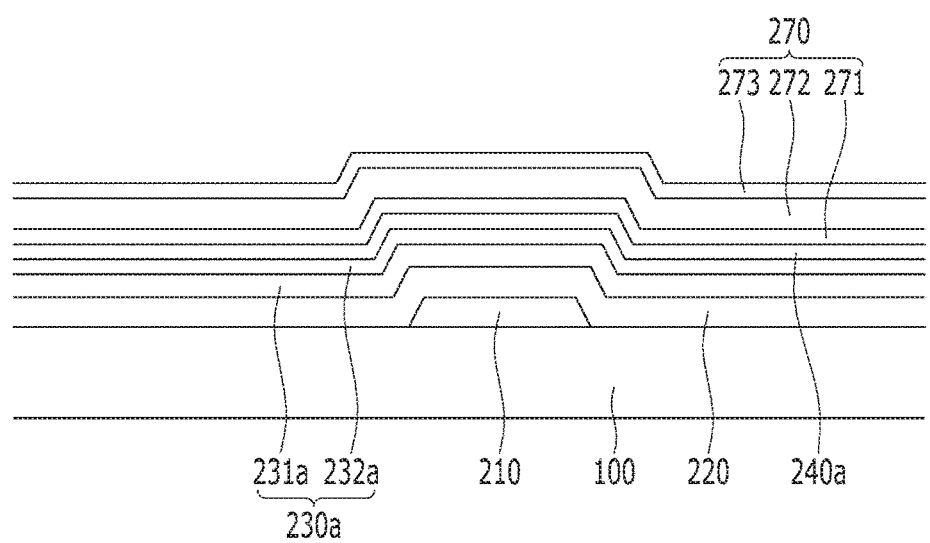

Referring to FIG. 4, a semiconductor material layer 230a, an ohmic contact material layer 240a, and a data metal layer 270 are sequentially formed on the gate insulating layer 220.

The semiconductor material layer 230a includes an oxide semiconductor layer 231a and an amorphous silicon layer 232a that are sequentially formed on the gate insulating layer 220. The amorphous silicon layer 232a may be thinner than the oxide semiconductor layer 231a. For example, the thickness of the amorphous silicon layer 232a may be about 100 Å or less, and the thickness of the oxide semiconductor layer 231a may be in the range of about 300 Å to about 500 Å. The amorphous silicon layer 232a may include amorphous silicon, and the oxide semiconductor layer 231a may include an oxide including at least one of zinc (Zn), gallium (Ga), tin (Sn), and indium (In).

The ohmic contact material layer 240a may include n+ hydrogenated amorphous silicon doped with an n-type impurity such as phosphorus (P) at a high concentration.

The data metal layer 270 includes a barrier metal layer 271, a wiring metal layer 272, and a capping metal layer 273 that are sequentially formed on the semiconductor material layer 230a. The wiring metal layer 272 may be thicker than the barrier metal layer 271 and the capping metal layer 273.

The barrier metal layer 271 and the capping metal layer 273 may be formed of a refractory metal or another metal having the excellent contact characteristics. The refractory metal may include molybdenum (Mo), titanium (Ti), chromium (Cr), tantalum (Ta), or alloys thereof, and the metal having excellent contact characteristics may include indium-zinc oxide (IZO) or indium-tin oxide (ITO).

The semiconductor material layer 230a, the ohmic contact material layer 240a, and the data metal layer 270 are etched to form a semiconductor layer, an ohmic contact layer, a source electrode, and a drain electrode, as described with reference to FIGS. 5 to 8.

Figure 5:
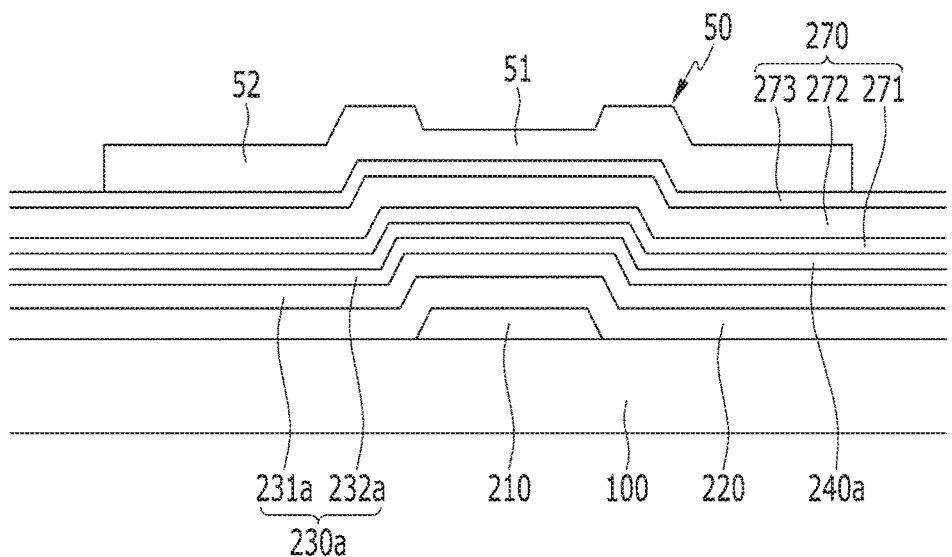

Referring to FIG. 5, a first photosensitive film 50 is formed on the data metal layer 270.

The first photosensitive film 50 includes a first portion 51 and a second portion 52 that is thicker than the first portion 51. The first portion 51 overlaps the gate electrode 210, and the second portion 52 is formed at a portion corresponding to a data line 255, a source electrode 250, and a drain electrode 260 that are formed later.

The first photosensitive film 50 is formed by using one mask. In one or more exemplary embodiments, the first photosensitive film 50 may be formed by using a half-tone mask.

The semiconductor material layer 230a, the ohmic contact material layer 240a, and the data metal layer 270 are etched by using the first photosensitive film 50 as a mask.

In this case, a first wet etching process using an etchant may be used to etch the data metal layer 270, and a dry etching process may be used to etch the ohmic contact material layer 240a and the semiconductor material layer 230a. The etchant used in the first wet etching process may include at least one of sodium peroxodisulfate ($Na_2SO_2O_8$), ammonium hydrogen difluoride ($NH_4HF_2$), nitric acid ($HNO_3$), and acetic acid ($CH_3COOH$).

Figure 6:
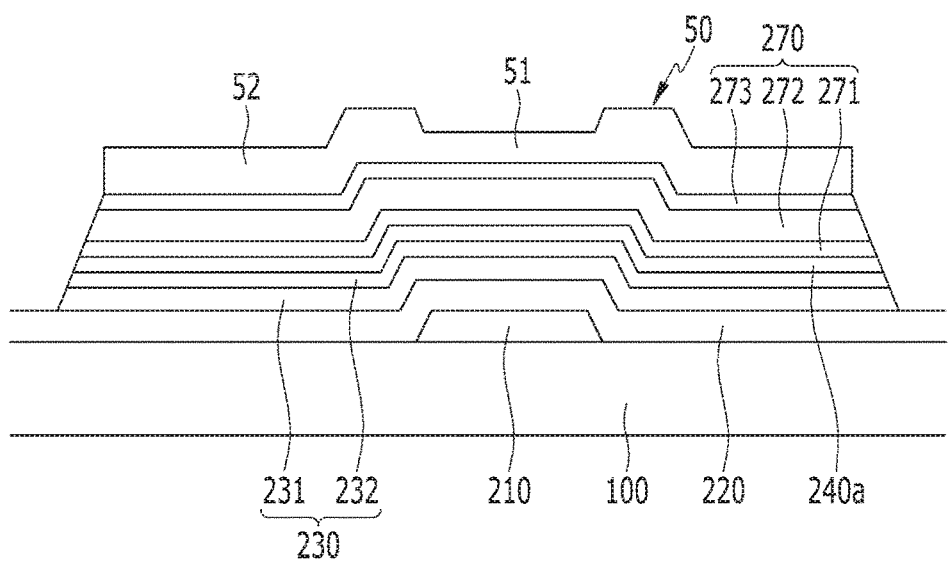

As the semiconductor material layer 230a is etched through the dry etching process, as shown in FIG. 6, the semiconductor layer 230 including the channel layer 231 and the auxiliary layer 232 is formed.

Figure 7:
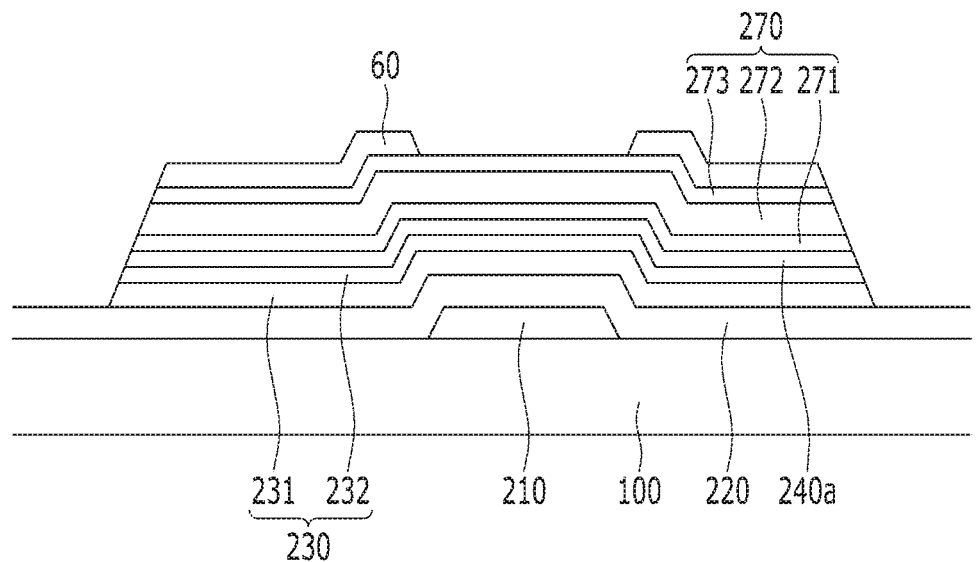

Referring to FIG. 7, the first photosensitive film 50 is subjected to an ashing process to form a second photosensitive film 60. In this case, the first portion 51 shown in FIG. 6 is removed and the thickness of the second portion 52 shown in FIG. 6 is reduced, thereby forming the second photosensitive film 60. That is, the second photosensitive film 60 exposes a portion of the data metal layer 270 overlapping the gate electrode 210.

Figure 8:
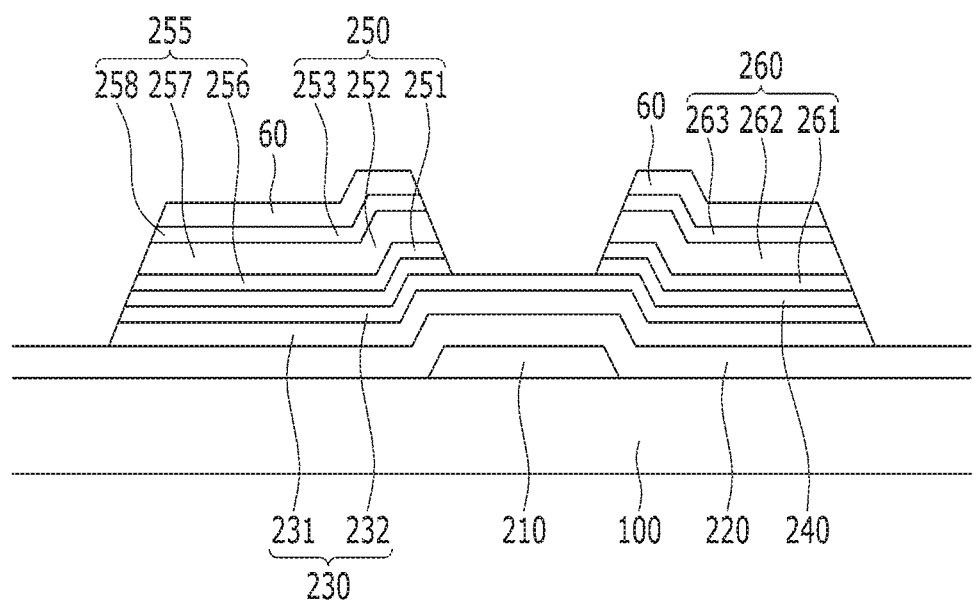

The ohmic contact material layer 240a and the data metal layer 270 are etched by using the second photosensitive film 60 as the mask, as shown in FIG. 8, to form a data line 255, a source electrode 250, a drain electrode 260, and an ohmic contact layer 240.

The data line 255, the source electrode 250, and the drain electrode 260 respectively include a barrier layer (256, 251, and 261), a wiring layer (257, 252, and 262), and a capping layer (258, 253, and 263).

The ohmic contact material layer 240a and the data metal layer 270 may be etched by using a second wet etching process. The etchant used in the second wet etching process may be the same as the etchant used in the first wet etching process.

In the second wet etching process, the ohmic contact material layer 240a formed of n+ hydrogenated amorphous silicon doped with n-type impurity at the high concentration is etched, however, the auxiliary layer 232 formed of amorphous silicon is not etched.

In the second wet etching process, after the n+ hydrogenated amorphous silicon generates an oxidation reaction with sodium peroxodisulfate ($Na_2SO_2O_8$) of the etchant, the n+ hydrogenated amorphous silicon may be etched due to an etching reaction generated by ammonium hydrogen difluoride ($NH_4HF_2$). However, the amorphous silicon does not cause the oxidation reaction with the etchant such that the auxiliary layer 232 is not etched.

In this way, while the data metal layer 270 and the ohmic contact material layer 240a are etched, as the auxiliary layer 232 is not etched, the channel layer 231 disposed under the auxiliary layer 232 is not affected by the etchant. That is, the auxiliary layer 232 functions as an etching prevention layer by protecting the channel layer 231 in the second wet etching process. Accordingly, it is not necessary to have another manufacturing step to form an additional etching prevention layer to protect the channel layer 231 in which the channel of the thin film transistor is formed, thereby simplifying the manufacturing process. Therefore, the manufacturing costs for the thin film transistor panel may be decreased.

Also, since the channel layer 231 is not affected by the etchant, the thickness of the channel layer 231 may be uniformly formed. Therefore, the channel layer 231 has improved characteristics, and the reliability of the thin film transistor may improve.

Referring to FIG. 2, after forming a passivation layer 310 including a contact hole 315, a pixel electrode 320 connected to the drain electrode 260 through the contact hole 315 is formed.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A thin film transistor comprising:
a gate electrode;
a semiconductor layer overlapping the gate electrode and including a channel layer and an auxiliary layer disposed on the channel layer; and
a source electrode and a drain electrode separated from each other and connected to the semiconductor layer,
wherein the channel layer comprises an oxide semiconductor and the auxiliary layer comprises amorphous silicon, and
wherein the auxiliary layer has substantially the same width as the channel layer.

2. A thin film transistor comprising:
a gate electrode;
a semiconductor layer overlapping the gate electrode and including a channel layer and an auxiliary layer disposed on the channel layer; and
a source electrode and a drain electrode separated from each other and connected to the semiconductor layer,
wherein the channel layer comprises an oxide semiconductor and the auxiliary layer comprises amorphous silicon, and
wherein a thickness of the auxiliary layer is about 100 Å or less.

3. The thin film transistor of claim 1, wherein the auxiliary layer is disposed between the channel layer and the source electrode, and between the channel layer and the drain electrode.

4. The thin film transistor of claim 1, wherein the source electrode and the drain electrode each include a barrier layer, a wiring layer, and a capping layer.

5. The thin film transistor of claim 4, wherein:
the barrier layer and the capping layer comprise at least one material selected from the group consisting of molybdenum (Mo), titanium (Ti), chromium (Cr), tantalum (Ta), indium-zinc oxide (IZO), or indium-tin oxide (ITO), and
the wiring layer comprises at least one material selected from the group consisting of copper (Cu), silver (Ag), or aluminum (Al).

6. The thin film transistor of claim 1, further comprising an ohmic contact layer disposed between the source electrode and the auxiliary layer, and between the drain electrode and the auxiliary layer.

7. A thin film transistor array panel comprising:
an insulation substrate;
a gate electrode disposed on the insulation substrate;
a semiconductor layer overlapping the gate electrode and including a channel layer and an auxiliary layer disposed on the channel layer;
a source electrode and a drain electrode separated from each other and connected to the semiconductor layer; and
a pixel electrode connected to the drain electrode,
wherein the channel layer comprises an oxide semiconductor and the auxiliary layer comprises amorphous silicon, and
wherein the auxiliary layer has substantially the same width as the channel layer.

8. A thin film transistor array panel comprising:
an insulation substrate;
a gate electrode disposed on the insulation substrate;
a semiconductor layer overlapping the gate electrode and including a channel layer and an auxiliary layer disposed on the channel layer;
a source electrode and a drain electrode separated from each other and connected to the semiconductor layer; and
a pixel electrode connected to the drain electrode,
wherein the channel layer comprises an oxide semiconductor and the auxiliary layer comprises amorphous silicon, and
wherein a thickness of the auxiliary layer is about 100 Å or less.

9. The thin film transistor array panel of claim 7, wherein the auxiliary layer is disposed between the channel layer and the source electrode, and between the channel layer and the drain electrode.

10. The thin film transistor array panel of claim 7, wherein the source electrode and the drain electrode each include a barrier layer, a wiring layer, and a capping layer that are stacked.

11. The thin film transistor array panel of claim 10, wherein:
the barrier layer and the capping layer comprise at least one material selected from the group consisting of molybdenum (Mo), titanium (Ti), chromium (Cr), tantalum (Ta), indium-zinc oxide (IZO), or indium-tin oxide (ITO), and
the wiring layer comprises at least one material selected from the group consisting of copper (Cu), silver (Ag), or aluminum (Al).

12. The thin film transistor array panel of claim 7, further comprising an ohmic contact layer disposed between the source electrode and the auxiliary layer, and between the drain electrode and the auxiliary layer.

13. A method for manufacturing a thin film transistor array panel, the method comprising the steps of:
forming a gate electrode on an insulation substrate;
forming a gate insulating layer on the gate electrode;
sequentially forming a semiconductor material layer, an ohmic contact material layer, and a data metal layer on the gate insulating layer; and
etching the semiconductor material layer, the ohmic contact material layer, and the data metal layer to form a semiconductor layer, an ohmic contact layer, a source electrode, and a drain electrode,
wherein the semiconductor material layer comprises an oxide semiconductor layer and an amorphous silicon layer disposed on the oxide semiconductor layer,
wherein the step of etching comprises etching the oxide semiconductor layer and the amorphous silicon layer with a single mask to form a channel layer and an auxiliary layer, and
wherein the auxiliary layer has substantially the same width as the channel layer.

14. A method for manufacturing a thin film transistor array panel, the method comprising the steps of:
forming a gate electrode on an insulation substrate;
forming a gate insulating layer on the gate electrode;
sequentially forming a semiconductor material layer, an ohmic contact material layer, and a data metal layer on the gate insulating layer; and
etching the semiconductor material layer, the ohmic contact material layer, and the data metal layer to form a semiconductor layer, an ohmic contact layer, a source electrode, and a drain electrode,
wherein the semiconductor material layer comprises an oxide semiconductor layer and an amorphous silicon layer disposed on the oxide semiconductor layer,
wherein the step of etching comprises etching the oxide semiconductor layer and the amorphous silicon layer with a single mask to form a channel layer and an auxiliary layer, and
wherein the amorphous silicon layer has a thickness of about 100 Å or less.

15. The method of claim 13, wherein:
the single mask comprises a first photosensitive film, and
the steps of forming the semiconductor layer, the ohmic contact layer, the source electrode, and the drain electrode comprise:
forming, on the data metal layer, the first photosensitive film including a first portion and a second portion thicker than the first portion,
etching the semiconductor material layer, the ohmic contact material layer, and the data metal layer by using the first photosensitive film as a mask,
ashing the first photosensitive film to remove the first portion of the first photosensitive film and to form a second photosensitive film having at least part of the second portion of the first photosensitive film, and
etching the ohmic contact material layer and the data metal layer by using the second photosensitive film as a mask.

16. The method of claim 15, wherein the step of etching the semiconductor material layer, the ohmic contact material layer, and the data metal layer by using the first photosensitive film as a mask comprises:
a first wet etching process of etching the data metal layer, and
a dry etching process of etching the semiconductor material layer and the ohmic contact material layer.

17. The method of claim 16, wherein the step of etching the ohmic contact material layer and the data metal layer by using the second photosensitive film as a mask comprises:
a second wet etching process of etching the ohmic contact material layer and the data metal layer.

18. The method of claim 17, wherein the first wet etching process and the second wet etching process use an etchant including one selected from the group consisting of sodium peroxodisulfate ($Na_2SO_2O_8$), ammonium hydrogen difluoride ($NH_4HF_2$), nitric acid ($HNO_3$), and acetic acid ($CH_3COOH$).

19. The method of claim 13, wherein the step of forming a data metal layer comprises forming a barrier layer, a wiring layer, and a capping layer.

20. The method of claim 19, wherein:
the barrier layer and the capping layer comprise at least one material selected from the group consisting of molybdenum (Mo), titanium (Ti), chromium (Cr), tantalum (Ta), indium-zinc oxide (IZO), or indium-tin oxide (ITO), and
the wiring layer comprises at least one material one selected from the group consisting of copper (Cu), silver (Ag), or aluminum (Al).

* * * * *